(12) United States Patent
Sushihara

(10) Patent No.: US 6,472,911 B1
(45) Date of Patent: Oct. 29, 2002

(54) OUTPUT BUFFER CIRCUIT OF SEMICONDUCTOR INTEGRATED CIRCUIT

(75) Inventor: Akihiro Sushihara, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/984,384

(22) Filed: Oct. 30, 2001

(51) Int. Cl.[7] .............................. H03B 1/00; H03K 3/00
(52) U.S. Cl. .................................. 327/112; 326/83
(58) Field of Search ............................ 327/108, 110, 327/112, 427, 434, 436, 437; 326/80, 81–87

(56) References Cited

U.S. PATENT DOCUMENTS

| | | | | |
|---|---|---|---|---|
| 5,949,259 A | * | 9/1999 | Garcia | 326/26 |
| 6,060,938 A | * | 5/2000 | Morrill | 326/27 |
| 6,236,248 B1 | * | 5/2001 | Koga | 326/27 |
| 6,285,236 B1 | * | 9/2001 | Stephens | 326/27 |
| 6,304,120 B1 | * | 10/2001 | Taito | 327/112 |
| 6,320,432 B1 | * | 11/2001 | Nagao | 327/108 |

FOREIGN PATENT DOCUMENTS

| | | |
|---|---|---|
| JP | 5-41091 | 2/1993 |
| JP | 5-122049 | 5/1993 |
| JP | 5-227003 | 9/1993 |
| JP | 10-163826 | 6/1998 |

* cited by examiner

Primary Examiner—My-Trang Nuton
(74) Attorney, Agent, or Firm—Volentine Francos, P.L.L.C.

(57) ABSTRACT

An output buffer circuit for a logical integrated circuit in which the peak value of switching noise is small thereby reducing the possibility of malfunctions. A main driver has first and second transistors. The first transistor increases and decreases the current flowing between a signal output terminal and a first power supply line inversely depending on a first control potential. The second transistor increases and decreases the current flowing between the signal output terminal and a second power supply line depending on a second control potential. A predriver turns on the first and second transistors at a low speed and turns them off at a high speed. As the first and second transistors are turned on at a low speed, the peak value of switching noise is small.

13 Claims, 18 Drawing Sheets

US 6,472,911 B1

OUTPUT BUFFER CIRCUIT OF SEMICONDUCTOR INTEGRATED CIRCUIT

BACKGROUND OF THE INVENTION

1. Field of the Invention

The present invention relates to technology for decreasing the malfunctions of an output buffer circuit provided to a semiconductor integrated circuit, and may be employed in an output buffer circuit for outputting logic signals.

2. Description of Related Art

An output buffer circuit is provided to a semiconductor integrated circuit. A general output buffer circuit comprises a pair of PMOS transistors and nMOS transistors. With a general output buffer circuit, the pMOS transistor is connected between a signal output terminal of the integrated circuit and a high-voltage generating line, and the nMOS transistor is connected between this signal output terminal and a low-voltage generating line (usually a ground line). When a logic signal is supplied to this pair of transistors, one of the transistors will be turned on and the other turned off. The output logic signal of the output buffer circuit is, for example, a high level when the pMOS transistor is turned on and a low level when the nMOS transistor is turned on.

The voltage value of the logic signal output from the output buffer circuit is, for example, several milliampere, which is an extremely large value. Thus, used as the transistor for structuring the output buffer circuit is a transistor with a large dimension; that is, a transistor having a large gate width and gate length.

With the output buffer circuit, switching noise is generated when the logic value of the output signal is switched. The switching noise vibrates the output potential of the output buffer circuit from the reversal of the logic value for a certain amount of time.

When numerous output buffer circuits are connected to the same power source and the same logical change is simultaneously implemented, the current flowing in the power supply line becomes extremely large. And, when the current flowing in the power supply line is extremely large, the switching noise of the output signal becomes large. An extremely large switching noise may cause malfunctions in the output buffer circuit.

When the power source current is small, the possibility of a malfunction occurring due to the switching noise is small. When lowering the power source current, however, the drive performance of the output circuit will decrease.

SUMMARY OF THE INVENTION

An object of the present invention is to provide an output buffer circuit of a semiconductor integrated circuit that will not malfunction easily.

Therefore, the output buffer circuit of a semiconductor integrated circuit according to the present invention comprises: a main driver having a first transistor for increasing and decreasing the current flowing between a signal output terminal and a first power supply line inversely depending on a first control potential, and a second transistor for increasing and decreasing the current flowing between the signal output terminal and a second power supply line depending on a second control potential; and a predriver for generating the first control potential and the second control potential by employing an input logic signal, and reducing the increase speed of the current of the first transistor or the second transistor by prolonging the fall time of the first control potential or rise time of the second control potential.

With the output buffer circuit according to the present invention, it is possible to decrease the peak value of switching noise by reducing the current increase speed when the first transistor or the second transistor is switched on. Thus, malfunctions in the output buffer circuit of the present invention do not occur easily.

BRIEF DESCRIPTION OF THE DRAWINGS

Other objects and advantages of the present invention are now explained with referenced to the following attached drawings.

DESCRIPTION OF THE PREFERRED EMBODIMENTS

Figure 1:
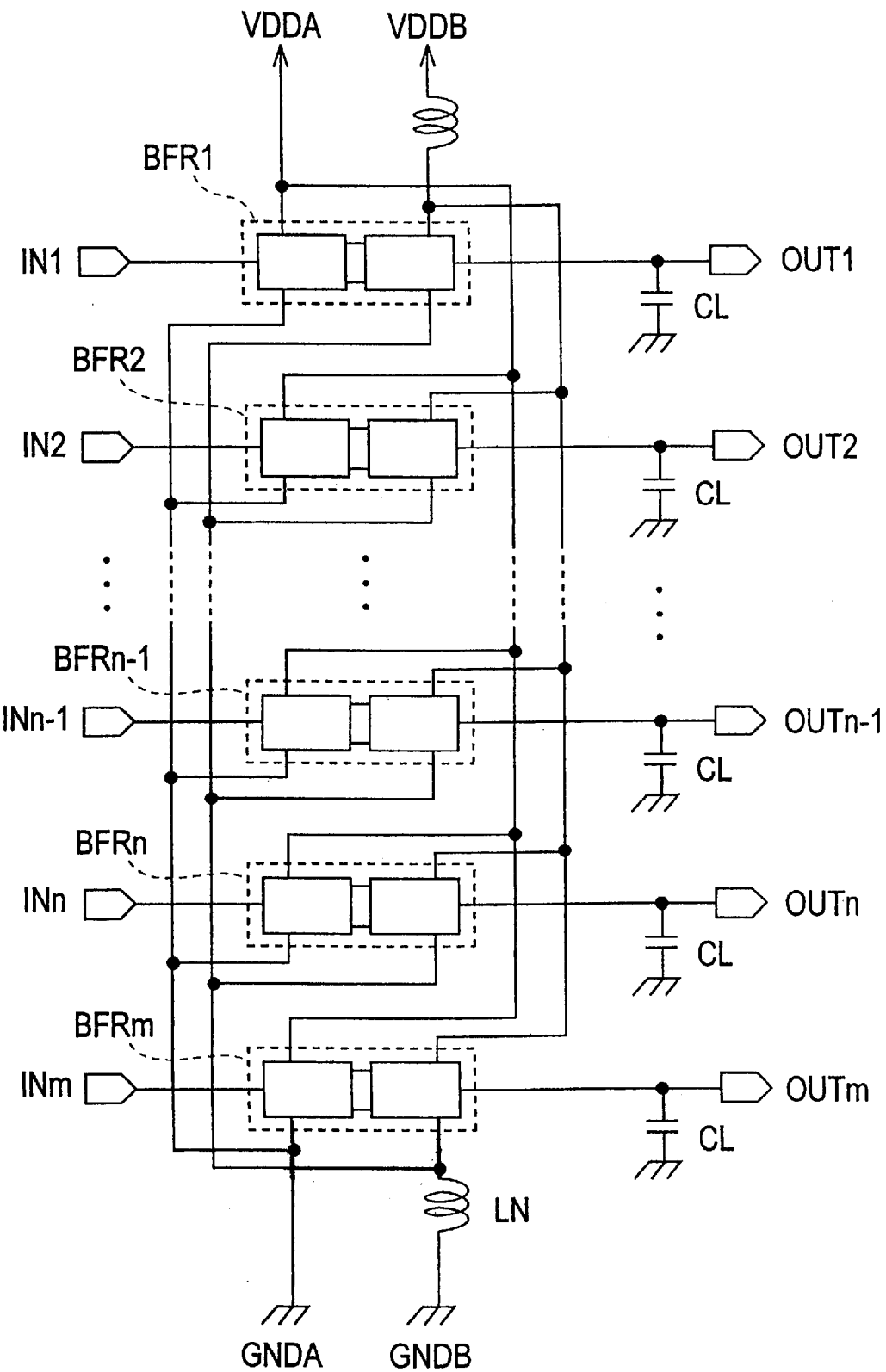
FIG. 1 is a circuit diagram showing the overall structure of the output buffer circuit according to the respective embodiments of the present invention.

Embodiments of the present invention are now explained with reference to the drawings. The size, shape and positional relationship of the respective structural components in the drawings are merely shown schematically such that the present invention may be comprehended, and the numerical conditions described below are only exemplifications thereof.

First Embodiment

The output buffer circuit according to the first embodiment is now explained with reference to FIG. 1 to FIG. 6.

FIG. 1 is an overall structural diagram of the output unit provided to an integrated circuit. As shown in FIG. 1, this output unit comprises n+1 output buffer circuits BFR1, BFR2, . . . , BFRn, BFRm. The output buffer circuits BFR1 to BFRn, BFRm are respectively connected to corresponding signal input terminals IN1 to INn, INm and corresponding signal output terminals OUT1 to OUTn, OUTm. The output buffer circuits BFR1 to BFRn input a low level or high level logic signal from the signal input terminal and output a logic signal having the same logic level as the input signal from the signal output terminal. Meanwhile, the input signal of the output buffer circuit BFRm is fixed to a high level, and the output signal is therefore also fixed to a high level.

The output buffer circuits BFR1 to BFRn, BFRm are connected to four types of power supply lines VDDA, VDDB, GNDA, GNDB.

Figure 2:
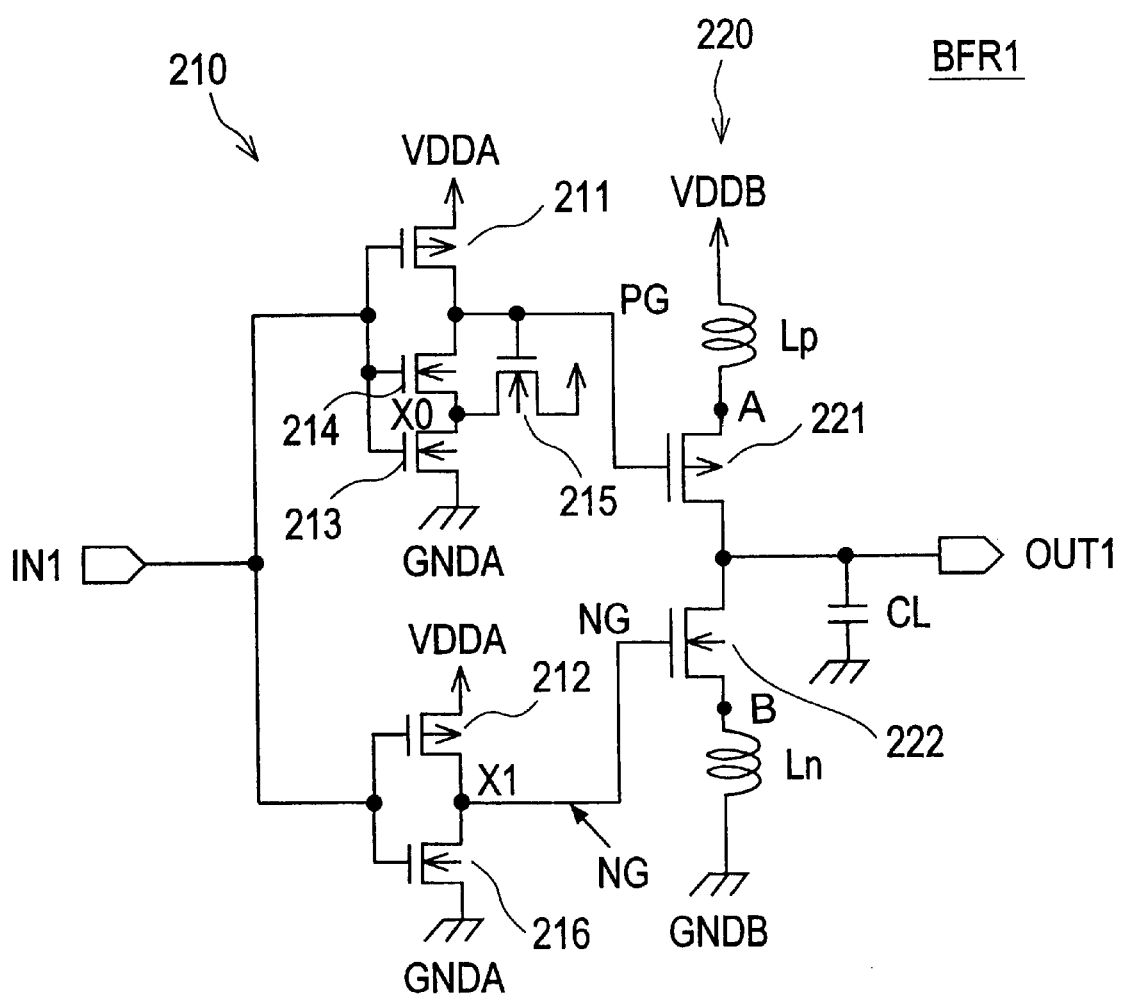
FIG. 2 is a circuit diagram showing the principle components of the output buffer circuit according to the first embodiment.

FIG. 2 is a circuit diagram showing the internal structure of the output buffer circuit BFR1. The internal structure of the other output buffer circuits BFR2 to BFRn, BFRm is also the same as shown in FIG. 2.

As illustrated in FIG. 2, the output buffer circuit BFR1 comprises a predriver unit 210 and a main driver unit 220.

The predriver unit 210 comprises pMOS transistors 211, 212 and nMOS transistors 213, 214, 215, 216.

The pMOS transistor 211 and nMOS transistors 213, 214, 215 constitute an inverter. In the pMOS transistor 211, the source is connected to the power supply line VDDA, the drain is connected to a node PG, and the gate is connected to the signal input terminal IN1. In the nMOS transistor 213, the source is connected to the power supply line GNDA, the drain is connected to a node X0, and the gate is connected to the signal input terminal IN1. In the nMOS transistor 214, the source is connected to the node X0, the drain is connected to the node PG, and the gate is connected to the signal input terminal IN1. In the nMOS transistor 215, the source is connected to the power supply line VDDA, the drain is connected to a node X0, and the gate is connected to the node PG.

The pMOS transistor 212 and nMOS transistor 216 constitute an inverter. In the pMOS transistor 212, the source is connected to the power supply line VDDA, the drain is connected to a node NG, and the gate is connected to the signal input terminal IN1. In the nMOS transistor 216, the source is connected to the power supply line GNDA, the drain is connected to a node NG, and the gate is connected to the signal input terminal IN1.

The main driver unit 220 comprises a pMOS transistor 221 and an nMOS transistor 222.

In the pMOS transistor 221, the source is connected to the power supply line VDDB via node A, the drain is connected to a signal output terminal OUT1, and the gate is connected to the node PG. In the nMOS transistor 222, the source is connected to the power supply line GNDB via node B, the drain is connected to the signal output terminal OUT1, and the gate is connected to the node NG.

Power supply lines VDDB, GNDB are connected to an external power source via a chip electrode pad and lead wire. The lead wire connected to the power supply line VDDB has an inductance Lp, and the lead wire connected to the power supply line GNDB has an inductance Ln. Moreover, wiring from the lines VDDB, GNDB to the signal output terminal OUT1 has a parasitic capacitance CL. In addition, when current flows between the power supply lines VDDB, GNDB and the signal output terminal OUT1, the pMOS transistor 211 and nMOS transistor 222 act as resistance.

Thus, a circuit connecting the power supply line VDDB, pMOS transistor 221 and signal output terminal OUT1 constitutes a single LCR circuit, and a circuit connecting the power line GNDB, nMOS transistor 222 and signal output terminal OUT1 constitutes another single LCR circuit. These LCR circuits cause switching noise.

Meanwhile, current in the power supply lines VDDA, GNDA is small and, therefore, the generation of switching noise in the predriver unit 210 can be disregarded.

Figure 3:
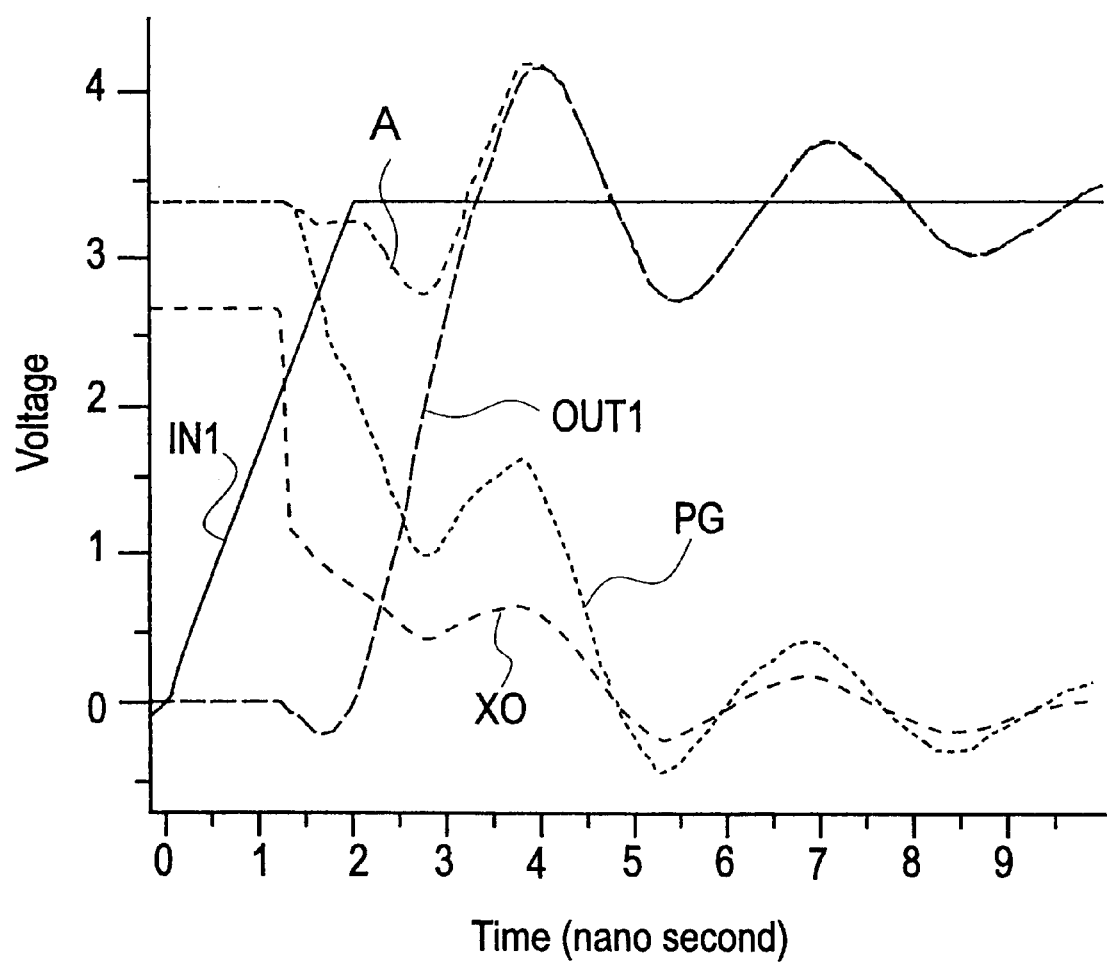
FIG. 3 is a graph showing the operation of the output buffer circuit illustrated in FIG. 2.

FIG. 3 is a diagram for explaining the operation of the output buffer circuits BFR1 to BFRn, BFRm illustrated in FIG. 1 and FIG. 2. FIG. 3 shows the electrical change of IN1, OUT1, A, PG and X0 when the potential of the signal input terminal IN1 changes from a low level to a high level.

As clear from FIG. 3, when the potential of the signal input terminal IN1 is of a low level, the pMOS transistor 212 is turned on, and the nMOS transistor 216 is turned off. Thus, the node NG is of a high level and, therefore, the nMOS transistor 222 is turned on. Further, when the potential of the signal input terminal IN1 is of a low level, the nMOS transistors 213, 214 are turned off, and the pMOS transistor 211 is turned on. Thus, the node PG is of a high level and, therefore, the pMOS transistor 221 is turned off. The potential of the signal output terminal OUT1 is therefore of a low level. Here, the nMOS transistor 215 is turned on since the node PG is of a high level. Thus, if the threshold value voltage of the nMOS transistor 215 is Vth, the potential of the node X0 is VDDA-Vth.

Thereafter, when the potential of the signal input terminal IN1 becomes a high level, the pMOS transistor 212 turns off, and the nMOS transistor 216 turns on. Thus, the node NG becomes a low level and, therefore, the nMOS transistor 222 turns off. Further, when the potential of the signal input terminal IN1 becomes a high level, the pMOS transistor 211 turns off and the nMOS transistors 213, 214 turn on. Here, the nMOS transistor 215 is outputting VDDA-Vth to the node X0. Thus, when the nMOS transistors 213, 214 turn on, the potential of the node PG reduces slowly. Thereafter, when the potential of the node PG becomes lower than the threshold value of the nMOS transistor 215, the nMOS transistor 215 turns off. Then, the potential of the node PG reaches the potential of the power supply line GNDA. By such operation as described above, the pMOS transistor 221 turns on slowly when the potential of the signal input terminal IN1 becomes a high level.

When the pMOS transistor 221 is turned on, current flows from the power supply line VDDB to the signal output terminal OUT1. As described above, the power supply line VDDB, pMOS transistor 221 and signal output terminal OUT1 constitute the LCR circuit, and the potential of the node A vibrates thereby. And, pursuant to this vibration, the potential of the signal output terminal OUT1 also vibrates. The amplitude of the power source potential is the largest immediately after the pMOS transistor 221 turns on, and then gradually decreases thereafter. According to the output buffer circuit of the present embodiment, the peak value of the power source potential is small since the pMOS transistor 221 turns on slowly.

Next, the operation of the output buffer circuit according to the present embodiment is compared with the operation of a comparative output buffer circuit; that is, an output buffer circuit not included in the embodiments hereof.

Figure 4:
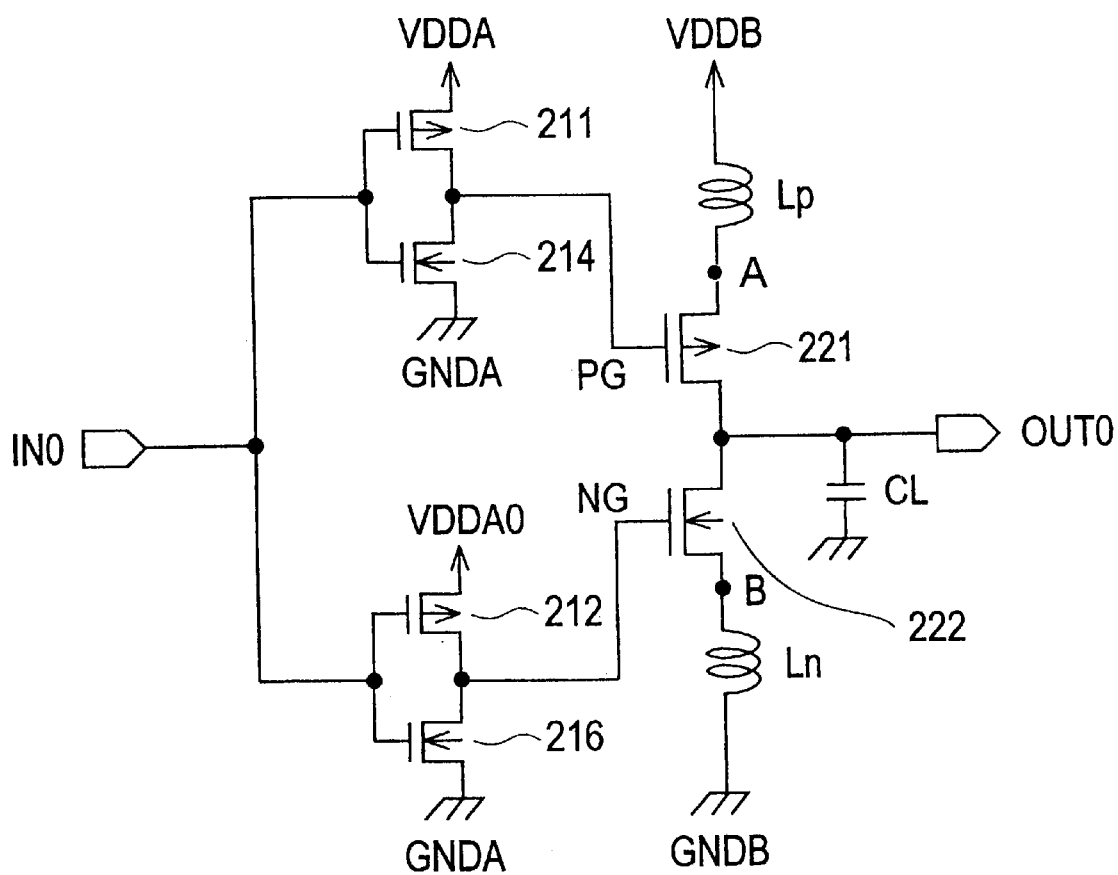
FIG. 4 is a circuit diagram showing the principle components of the output buffer circuit for comparison.

FIG. 4 is a circuit diagram showing the structure of a comparative output buffer BFR0. The output buffer circuit BFR0 shown in FIG. 4 does not comprise the nMOS transistors 213, 215. In other words, the output buffer circuit of FIG. 4 does not comprise a circuit for gradually raising the potential of the node PG. With this comparative output buffer circuit, the source of the nMOS transistor 214 is directly connected to the power supply line GNDA.

Figure 5:
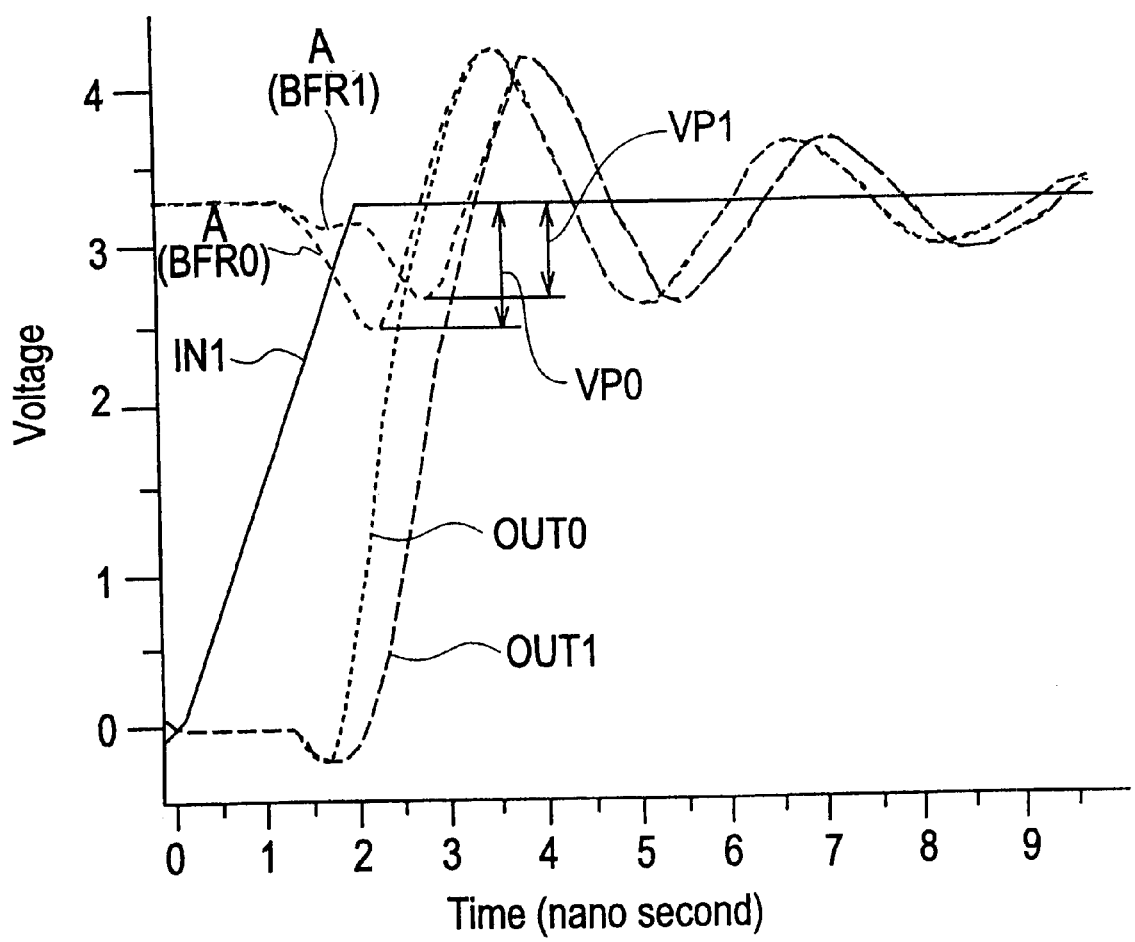
FIG. 5 is a graph for comparing the operation of the output buffer circuits illustrated in FIG. 2 and FIG. 4.

FIG. 5 is a diagram for comparing the operation of the output buffer circuit BFR and the operation of the output buffer circuit BFR0.

As described above, the comparative output buffer circuit BFRO does not comprise the nMOS transistors 213, 215. Thus, when the potential of the signal input terminal IN1 is of a low level, the source potential of the nMOS transistor 213; that is, the potential of the node X0 is not VDDA-Vth, but rather the potential of the power supply line GNDA (0 volts for example) Thus, when the nMOS transistor 214 turns on as a result of the potential of the signal input terminal IN1 becoming a high level, the potential of the node PG suddenly decreases. The pMOS transistor 221 is thereby turned on at a high speed. Thus, the potential of the signal output terminal OUT1 vibrates strongly.

As shown in FIG. 5, with the output buffer circuit BFR of the present embodiment, the peak potential of the node A is VP1. This value VP1 is higher than the peak potential VP0 upon using the comparative output buffer circuit BFR0. Thus, the output buffer circuit BFR1 of the present embodiment does not malfunction as much as the comparative output buffer circuit BFR0 due to the reasons described below.

As described above, with the output buffer circuits BFR1 to BFRn of FIG. 1, the logical level of the output signal changes in accordance with the change of the logical level of the input signal. Meanwhile, the input logical level of the output buffer circuit BFRm is fixed to a high level. That is, with the output buffer circuit BFRm, the pMOS transistor 221 is fixed to an on-state and the nMOS transistor 222 is fixed to an on-state. Therefore, the output logical level of this circuit BFRm is also fixed to a high level.

Figure 6:
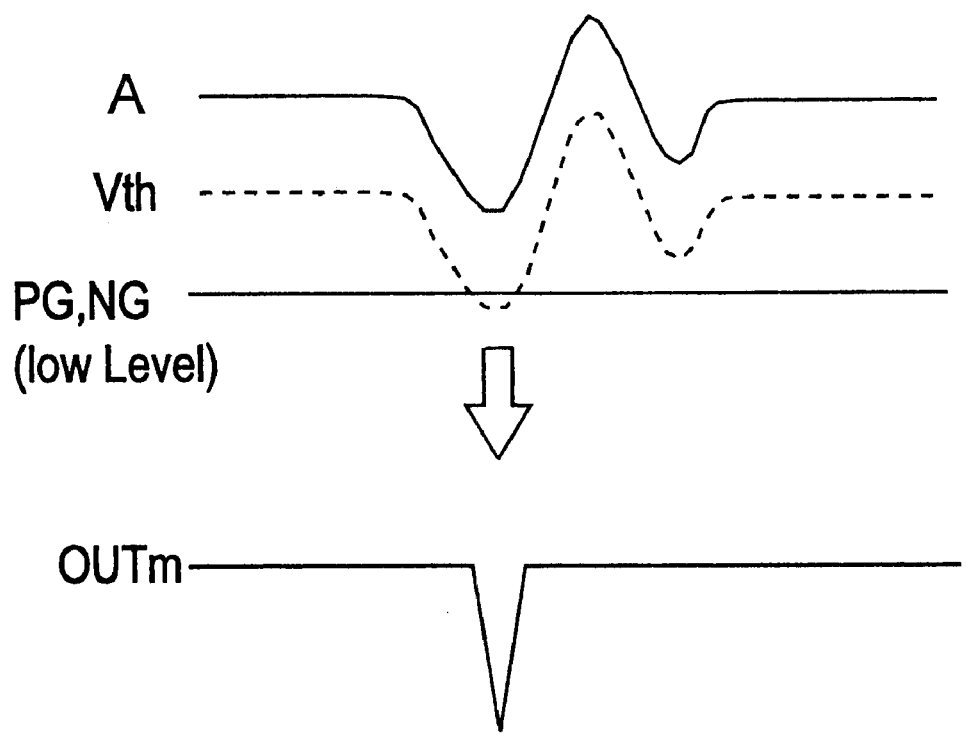
FIG. 6 is a conceptual diagram for explaining the fundamental principle of the output buffer circuit illustrated in FIG. 2.

When the respective output signals of the output buffer circuits BFR1 to BFRn simultaneously change from a low level to a high level, an extremely large current flows to the power supply line VDDB and the potential of the node A thereby vibrates strongly. Therefore, the voltage between the source and drain of the MOS transistors 221, 222 vibrates strongly. Thereby, as shown in FIG. 6, the operational threshold values of the MOS transistors 221, 222 also vibrate. And, when this operational threshold value becomes lower than the potential of the nodes PG, NG, the nMOS transistor 221 is temporarily turned on and the pMOS transistor 222 is temporarily turned off in the output buffer circuit BFRm. Thereby, malfunctions of the output buffer circuit BFRm; that is, the phenomenon of the output becoming temporarily a low level arises. Nevertheless, as described above, since the peak potential of the node A according to the present embodiment is high (VP1 of FIG. 5), the peak potential of threshold values of the MOS transistors 221, 222 is also high. Thus, the possibility of the output buffer circuit of the present embodiment malfunctioning when the input potential changes from a low level to a high level is small.

Moreover, even in cases when each and every output signal of the output buffer circuits BFR1 to BFRn do not change to a high level, the switching noise of the output buffer circuit maintaining a high level could be large when numerous output buffer circuits change to a high level simultaneously. Even in such a case, the output buffer circuit of the present embodiment does not malfunction easily.

With the output buffer circuit according to the present embodiment, although the turn-on speed of the pMOS transistor 221 is slow, the turn-off speed of the nMOS transistor 222 is approximate to that of the comparative output buffer circuit (c.f. FIG. 4). In other words, when the input signal changes from a high level to a low level, the nMOS transistor 222 is turned off at a high speed. Thus, the operational speed of the output buffer circuit is not any slower in comparison to the comparative output buffer circuit.

In addition, since the turn-off speed of the nMOS transistor 222 is sufficiently fast, current penetrating through the MOS transistors 221, 222 when the output signal changes to a high level is small and, therefore, power consumption is small.

Second Embodiment

The output buffer circuit according to the second embodiment is now explained with reference to FIG. 7 to FIG. 10. The overall structure of the output unit according to the present invention is the same as the output unit of the first embodiment (c.f. FIG. 1).

Figure 7:
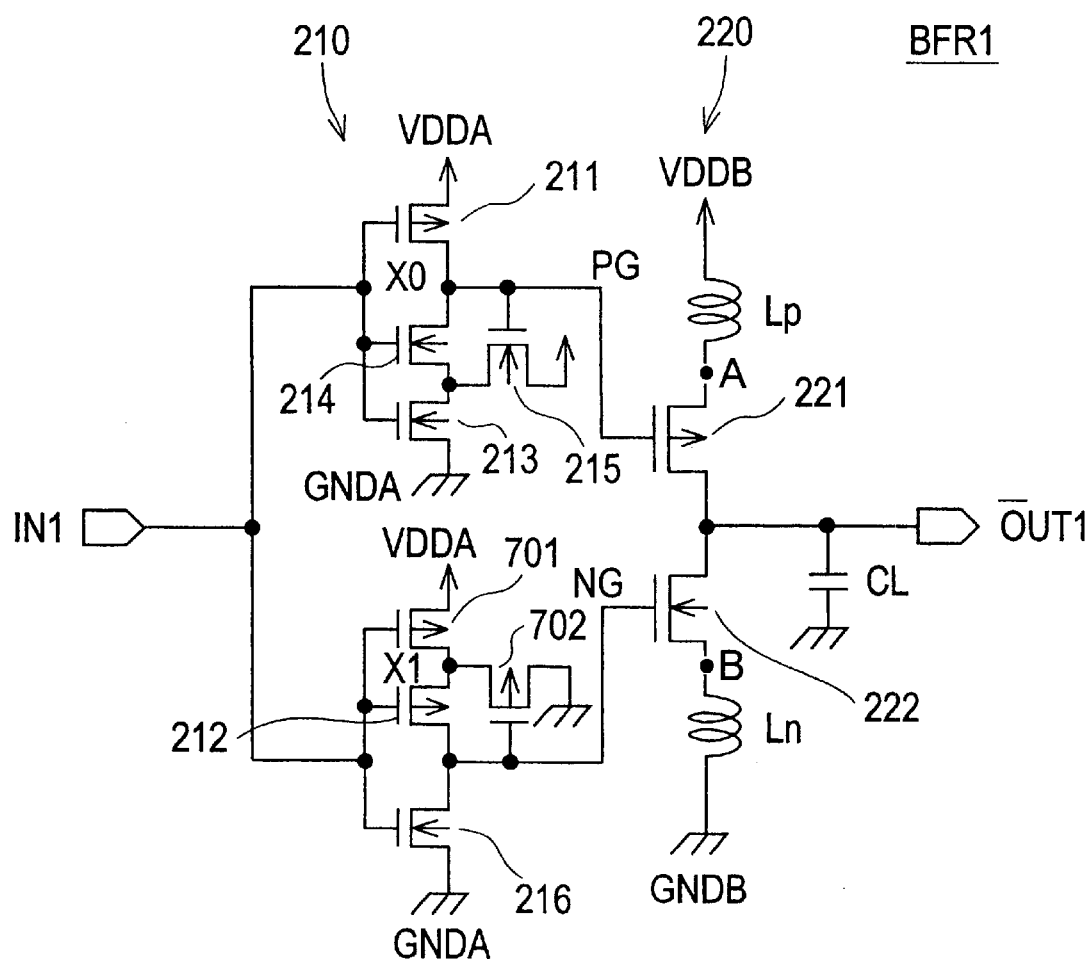
FIG. 7 is a circuit diagram showing the principle components of the output buffer circuit according to the second embodiment.

FIG. 7 is a circuit diagram showing the internal structure of the output buffer circuit BFR1. The internal structure of the other output buffer circuits BFR2 to BFRn, BFRm is also the same as FIG. 7. In FIG. 7, the structural components having the same reference numeral as FIG. 2 are the same as with FIG. 2, respectively.

As shown in FIG. 7, the predriver unit 210 of the present embodiment comprises pMOS transistors 701, 702.

The pMOS transistor 701 is provided between the pMOS transistor 212 and power supply line VDDA. That is, the source of the pMOS transistor 701 is connected to the power supply line VDDA, and the drain is connected to the source of the pMOS transistor 212. The connection point of the drain of the pMOS transistor 701 and the source of the pMOS transistor 212 will hereinafter be referred to as a node X1. The gate of the pMOS transistor 701 is connected to the signal input terminal IN1.

In the pMOS transistor 702, the source is connected to the power supply line GNDA, the drain is connected to the node X1, and the gate is connected to the node NG.

Figure 8:
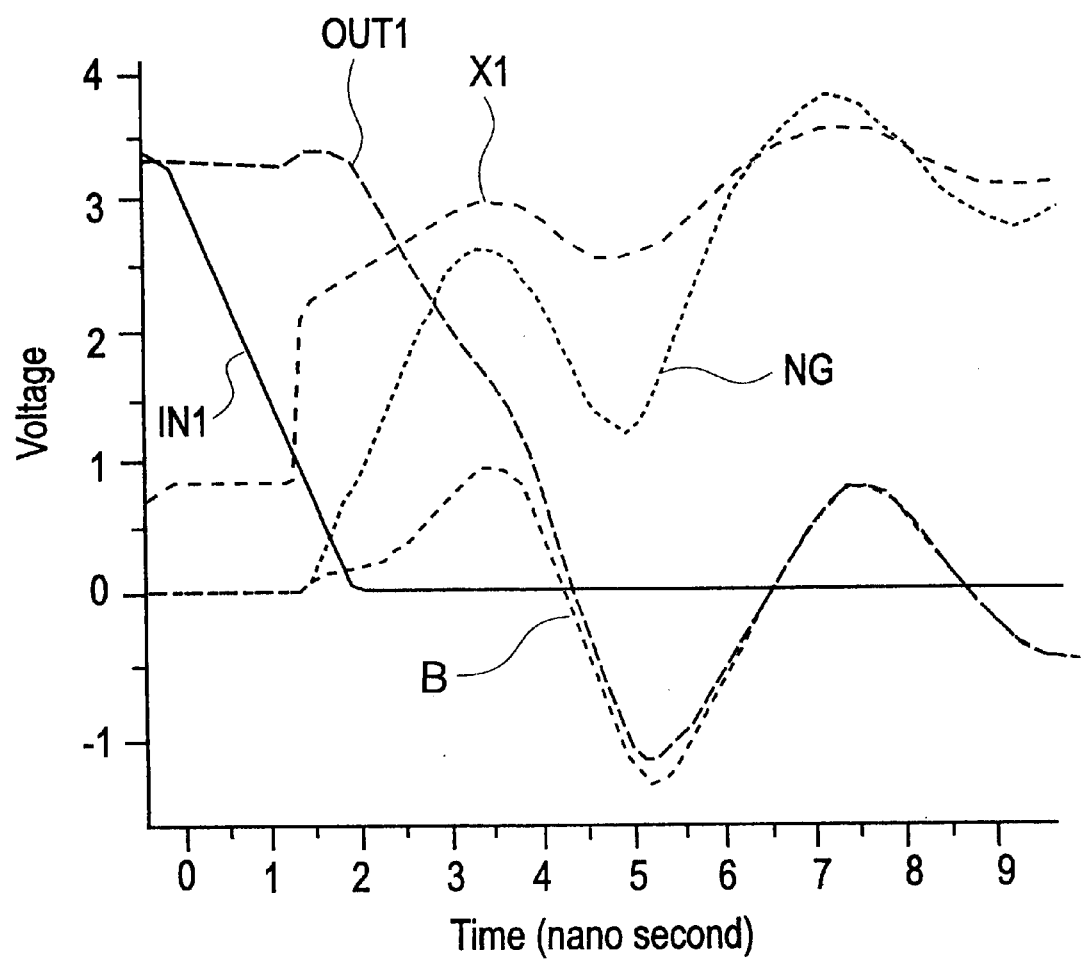
FIG. 8 is a graph showing the operation of the output buffer circuit illustrated in FIG. 7.

FIG. 8 is a diagram showing the electrical change of IN1, OUT1, B, NG and X1 when the potential of the signal input terminal IN1 changes from a high level to a low level.

As clear from FIG. 8, when the potential of the signal input terminal IN1 is of a high level, the nMOS transistor 216 is turned on and the pMOS transistors 212, 701 are turned off. Thus, the node NG is of a low level and, therefore, the nMOS transistor 222 is turned off. Moreover, when the potential of the signal input terminal IN1 is of a high level, the nMOS transistors 213, 214 are turned on and the pMOS transistor 211 is turned off. Thus, the node PG is of low level and, therefore, the pMOS transistor 221 is turned on. And, the potential of the signal output terminal OUT1 is of a high level. Further, since the node NG is of a low level, the pMOS transistor 702 is turned on. Thus, if the threshold value voltage of the pMOS transistor 702 is Vtp, the potential of the node X1 is Vtp (when GNDA is 0 volts). Meanwhile, since the node PG is of a low level, the nMOS transistor 215 is turned off. Therefore, the potential of the node X0 is GNDA.

Thereafter, when the potential of the signal input terminal IN1 becomes a low level, the nMOS transistor 216 turns off and the pMOS transistors 212, 701 turn on. Here, the potential of the node X1 is maintained at Vtp pursuant to the pMOS transistor 702 and, therefore, when the nMOS transistors 212, 701 turn on, the potential of the node NG slowly rises. And, when the potential of the node NG becomes higher than the threshold value of the pMOS transistor 702, the pMOS transistor 702 turns off. Thereafter, the potential of the node NG reaches the potential of the power supply line VDDA; that is, it reaches a high level. The nMOS transistor 222 thereby turns on. In the present embodiment, since the pMOS transistors 701, 702 are provided, the nMOS transistor 222 turns on slowly. Moreover, when the potential of the signal input terminal IN1 becomes a low level, the pMOS transistor 211 turns off and the nMOS transistors 213, 214 turn on. The potential of the node PG thereby becomes a low level and the pMOS transistor 221 therefore turns off. Here, when the potential of the signal input terminal IN1 becomes a low level, the nMOS transistor 215 is turned off and, therefore, the nMOS transistor 215 does not affect the operation of the nMOS transistors 213, 214.

When the nMOS transistor 222 turns on, current flows from the signal output terminal OUT1 to the power supply source GNDB. As described above, the power supply line GNDB, nMOS transistor 222 and signal output terminal OUT1 structure the LCR circuit and the potential of the node B vibrates thereby. Therefore, the potential of the signal output terminal also vibrates. The amplitude of the node B is the largest immediately after the nMOS transistor 222 turns on, and then gradually decreases thereafter. According to the output buffer circuit of the present embodiment, the amplitude of the node B becomes small since the nMOS transistor 222 slowly turns on.

The operation of the output buffer circuit upon the potential of the signal input terminal IN1 changing from a low level to a high level about the same as the operation of the first embodiment and, therefore, the explanation thereof is omitted.

Next, the operation of the output buffer according to the present embodiment is compared with the operation of the comparative output buffer circuit (c.f. FIG. 4).

Figure 9:
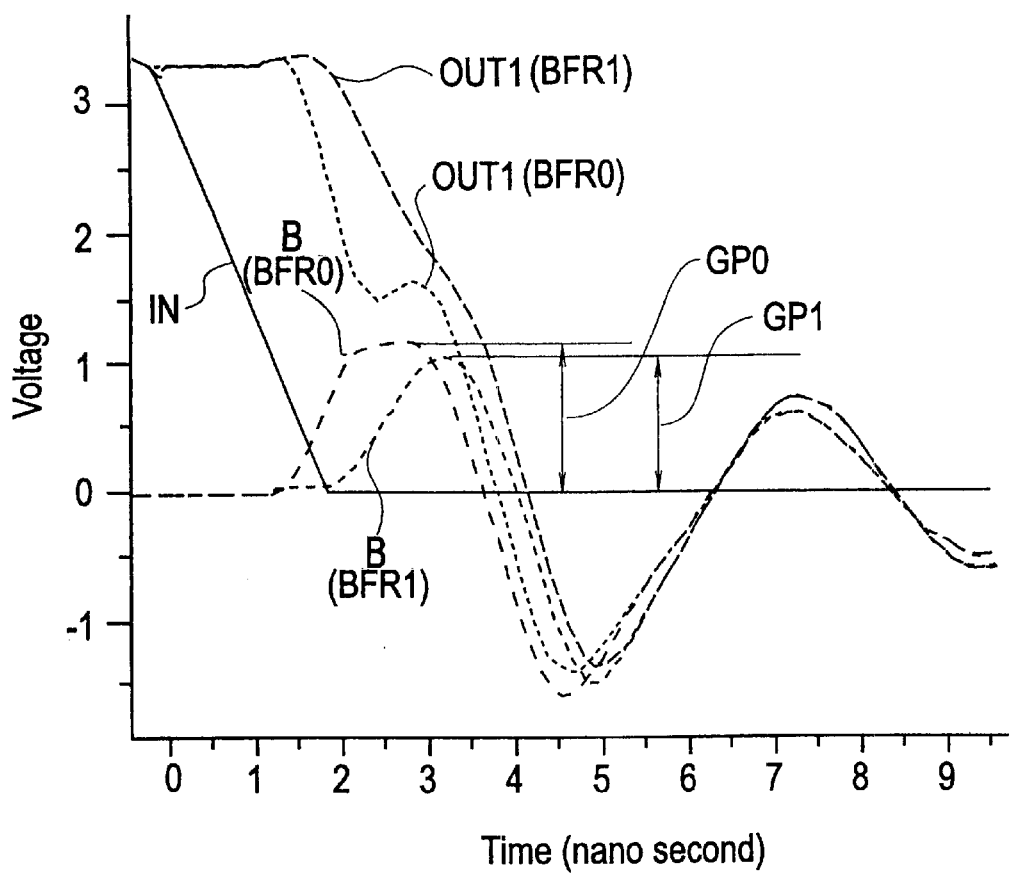
FIG. 9 is a graph for comparing the operation of the output buffer circuits illustrated in FIG. 7 and FIG. 4.

FIG. 9 is a diagram for comparing the operation of the output buffer circuit of the present invention and the operation of the comparative output buffer circuit.

As clear from FIG. 4, the comparative output buffer circuit BFR0 does not comprise pMOS transistors 701, 702. Thus, when the potential of the signal input terminal IN1 is of a high level, the source potential of the PMOS transistor 212 is not Vtp, but rather the potential of the power supply line VDDA. Therefore, when the potential of the signal input terminal IN1 becomes a low level and the pMOS transistor 212 is turned on, the potential of the node NG suddenly rises. The nMOS transistor 222 is thereby turned on at a high speed. The potential of the signal output terminal OUT1 therefore vibrates strongly.

As shown in FIG. 9, with the output buffer circuit BFR1 of the present embodiment, the peak potential of the node B is GP1. This value GP1 is lower than the peak potential GP0 upon using the comparative output buffer circuit BFR0. Thus, the output buffer circuit of the present embodiment does not malfunction as much as the comparative output buffer circuit due to the reasons described below.

Figure 10:
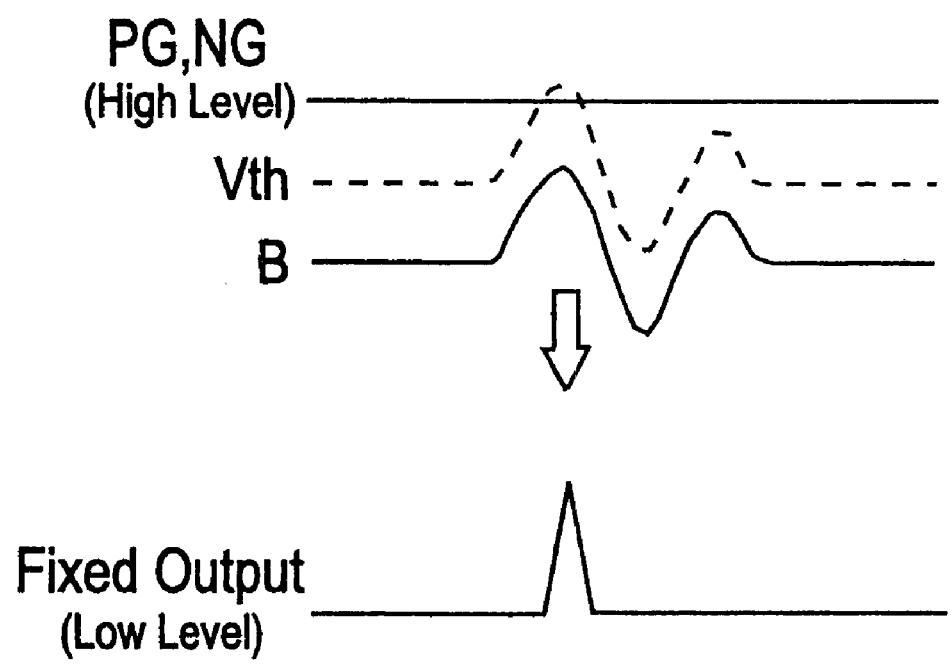
FIG. 10 is a conceptual diagram for explaining the fundamental principle of the output buffer circuit illustrated in FIG. 2.

When there are numerous output buffer circuits that change from a high level to a low level among the output buffer circuits BFR1 to BFRn, an extremely large current flows to the power supply line GNDB and the potential of the power supply line GNDB vibrates strongly as a result of the switching noise caused thereby. Thus, the voltage between the source and drain of the MOS transistors 221, 222 (c.f. FIG. 7) vibrate strongly. Thereby, as shown in FIG. 10, the threshold value Vth of the MOS transistors 221, 222 also vibrates. And, when this threshold value Vth becomes higher than the potential of the nodes PG, NG, the pMOS transistor 221 is temporarily turned on and the nMOS transistor 222 is temporarily turned off. Thereby, malfunctions of the output buffer circuit of which the output is fixed to a low level; that is, the phenomenon of the output becoming temporarily a high level arises. Nevertheless, as described above, since the peak potential of the node B according to the present embodiment is low (GP1 of FIG. 9), the peak potential Vth of threshold values of the MOS transistors 221, 222 is also low. Thus, the possibility of the output buffer circuit of the present embodiment malfunctioning when the input potential changes from a low level to a high level is small.

Additionally, the output buffer circuit of the present embodiment does not malfunction easily even when the potential of the signal input terminal IN1 changes from a low level to a high level for the same reasons as those of the first embodiment.

Moreover, when fixing the output signal of the output buffer circuit BFRm to a low level, the switching noise could be large when other output buffer circuits BFR1 to BFRn change to a low level simultaneously. Even in such a case, the output buffer circuit of the present embodiment does not malfunction easily.

With the output buffer circuit according to the present embodiment, although the turn-on speed of the pMOS transistors 221, 222 is slow, the turn-off speed of the MOS transistors 221, 222 is sufficiently fast. Thus, the operational speed of the output buffer circuit is not any slower in comparison to the comparative output buffer circuit.

In addition, since the turn-off speed of the MOS transistors 221, 222 is sufficiently fast, current penetrating through the MOS transistors 221, 222 when the output signal changes to a high level is small and, therefore, power consumption is small.

Third Embodiment

The output buffer circuit according to the third embodiment is now explained with reference to FIG. 11 to FIG. 15.

The overall structure of the output unit according to the present invention is the same as the output unit of the first embodiment (c.f. FIG. 1).

Figure 11:
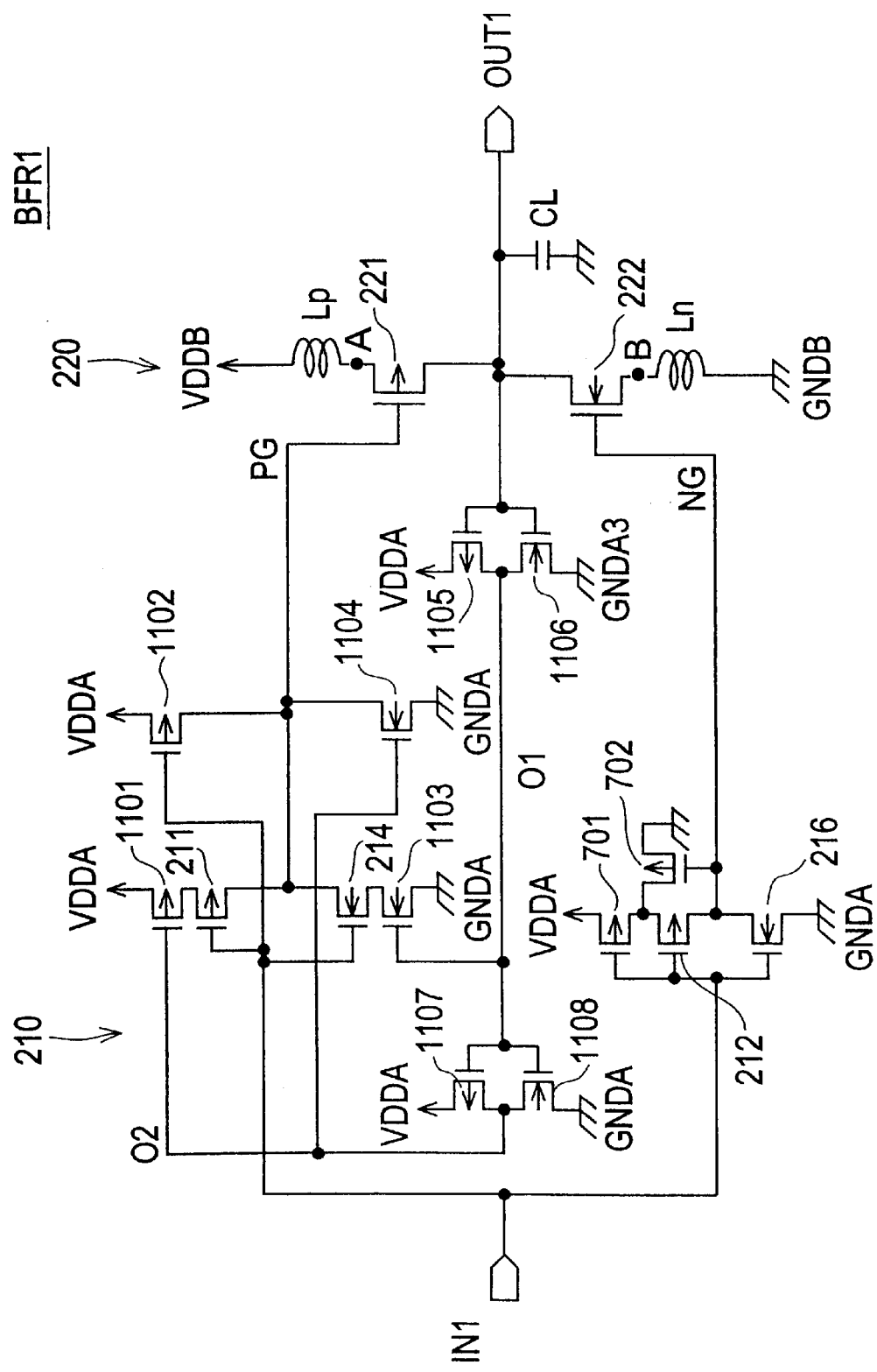
FIG. 11 is a circuit diagram showing the principle components of the output buffer circuit according to the third embodiment.

FIG. 11 is a circuit diagram showing the internal structure of the output buffer circuit BFR1. The internal structure of the other output buffer circuits BFR2 to BFRn, BFRm is also the same as FIG. 11. The structural components having the same reference numeral as FIG. 2 and FIG. 7 are the same as with FIG. 2 and FIG. 7, respectively.

As shown in FIG. 11, the predrive unit 210 of the present embodiment comprises pMOS transistors 1101, 1102, 1105, 1107 and nMOS transistors 1103, 1104, 1106, 1108.

The pMOS transistor 1101 is provided between the pMOS transistor 211 and the power supply line VDDA. That is, the source of the pMOS transistor 1101 is connected to the power supply line VDDA, and the drain of the pMOS transistor 1101 is connected to the source of the pMOS transistor 211. The gate of the pMOS transistor 1101 is connected to a node O2.

In the pMOS transistor 1102, the source is connected to the power supply line VDDA, the drain is connected to the node PG, and the gate is connected to the signal input terminal IN1.

The nMOS transistor 1103 is provided between the nMOS transistor 214 and the power supply line GNDA. That is, the source of the nMOS transistor 1103 is connected to the power supply line GNDA, and the drain of the nMOS transistor 1103 is connected to the source of the nMOS transistor 214. The gate of the nMOS transistor 1103 is connected to a node O1.

In the nMOS transistor 1104, the source is connected to the power supply line GNDA, the drain is connected to the node PG, and the gate is connected to the node O2.

The pMOS transistor 1105 and nMOS transistor 1106 constitute an inverter. That is, in the pMOS transistor 1105, the source is connected to the VDDA and the drain is connected to the node O1. Moreover, in the nMOS transistor 1106, the source is connected to the power supply line GNDA and the drain is connected to the node O1. The gates of transistors 1105, 1106 are connected to the signal output terminal OUT1.

The PMOS transistor 1107 and nMOS transistor 1108 constitute an inverter. That is, in the pMOS transistor 1107, the source is connected to the VDDA and the drain is connected to the node O2. Moreover, in the nMOS transistor 1108, the source is connected to the power supply line GNDA and the drain is connected to the node O2. The gates of transistors 1107, 1108 are connected to the node O1.

Although pMOS transistors 701, 702 are provided to the output buffer circuit depicted in FIG. 11, they are not essential. For example, similar to FIG. 2, it would be possible to use an inverter constituted only by MOS transistors 212, 216.

Figure 12:
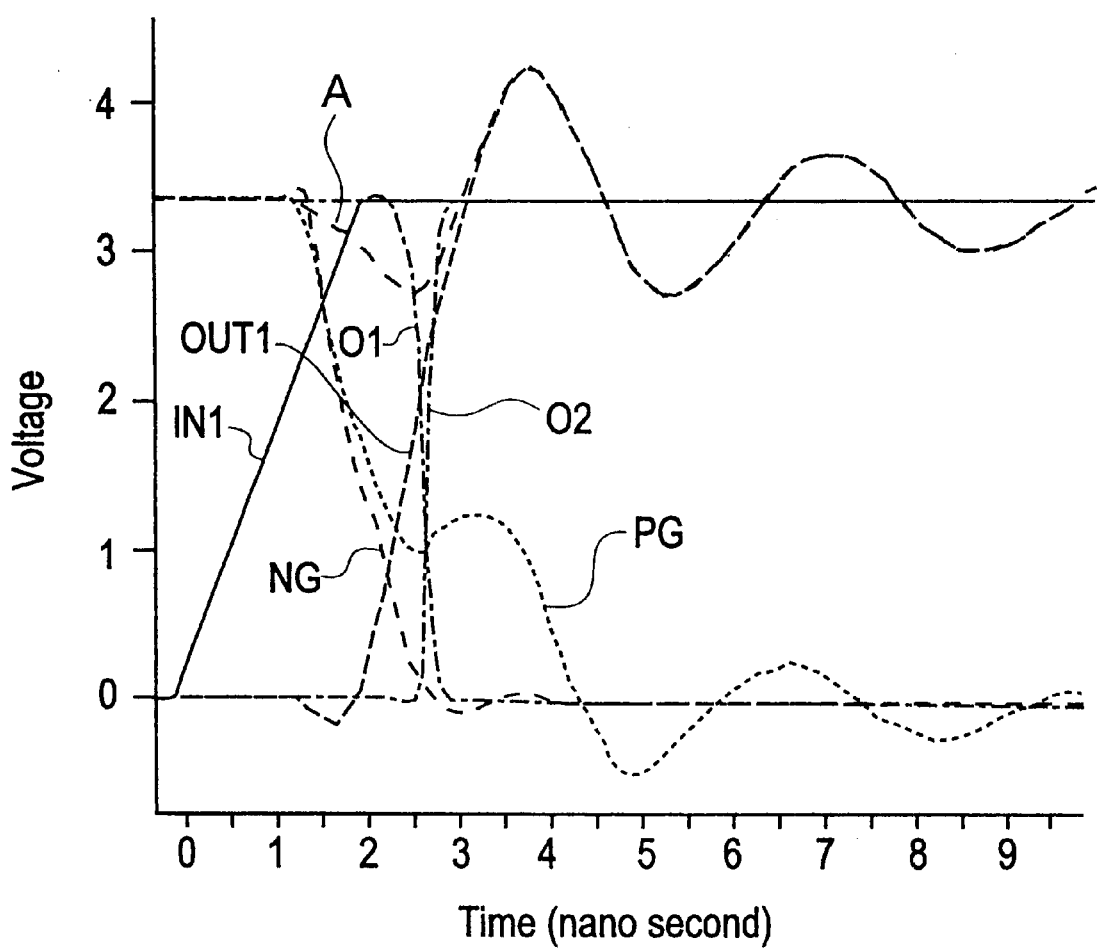
FIG. 12 is a graph showing the operation of the output buffer circuit illustrated in FIG. 11.

FIG. 12 is a diagram showing the electrical change of IN1, OUT1, A, PG, NG, O1 and O2 when the potential of the signal input terminal IN1 is changed from a low level to a high level.

When the potential of the signal input terminal IN1 is of a low level, the node NG is a high level due to the same reasons as with the second embodiment and, therefore, the nMOS transistor 222 is turned on. Moreover, when the potential of the signal input terminal IN1 is of a low level, the PMOS transistors 211, 1102 are turned on, and the pMOS transistor 214 is turned off. By turning on the pMOS transistor 1102, the node PG becomes a high level, and the pMOS transistor 221 is thereby turned off. Thus, the potential of the signal output terminal OUT1 is of a low level.

When the potential of the signal output terminal OUT1 is of a low level, the potential of the node O1 is of a high level. The nMOS transistor 1103 is thereby turned on. Further, when the potential of the node O1 is of a high level, the potential of the node O2 is of a low level. Thus, the pMOS transistor 1101 is turned on and the nMOS transistor 1104 is turned off.

When the potential of the signal input terminal IN1 changes to a high level, the pMOS transistors 212, 701 turn off and the nMOS transistor 216 turns on. Thus, the node NG changes to a low level and, therefore, the nMOS transistor 222 turns off. In addition, when the potential of the signal input terminal IN1 changes to a high level, the pMOS transistors 211, 1102 turn off and the nMOS transistor 214 turns on. The potential of the node PG thereby falls. When the potential of the node PG lowers to a threshold value of the pMOS transistor 221, the pMOS transistor 221 turn on and, therefore, the potential of the signal output terminal OUT1 rises.

When the potential of the signal output terminal OUT1 rises, the potential of the node O1 falls and, therefore, the potential of the node O2 rises. Then, when the potential of the node O1 reaches the threshold value of the nMOS transistor 1103, this nMOS transistor 1103 turns off. Here, the potential of the node O2 has not yet reached the threshold value of the nMOS transistor 1104. Thus, the nMOS transistor 1104 is turned off and, therefore, the node PG is in a floating state. Thereafter, when the potential of the node O2 reaches the threshold value of the nMOS transistor 1104, this nMOS transistor 1104 turns on. When the node PG reaches a complete low level, the pMOS transistor 221 is turned on completely.

As described above, the output buffer circuit of the present embodiment delays the on-operation of the pMOS transistor 221 by utilizing the time delay of turning on the inverters 1107, 1108.

Next, the operation of the output buffer circuit according to the present embodiment is compared with the operation of the output buffer circuit according to the first embodiment (c.f. FIG. 2).

Figure 13:
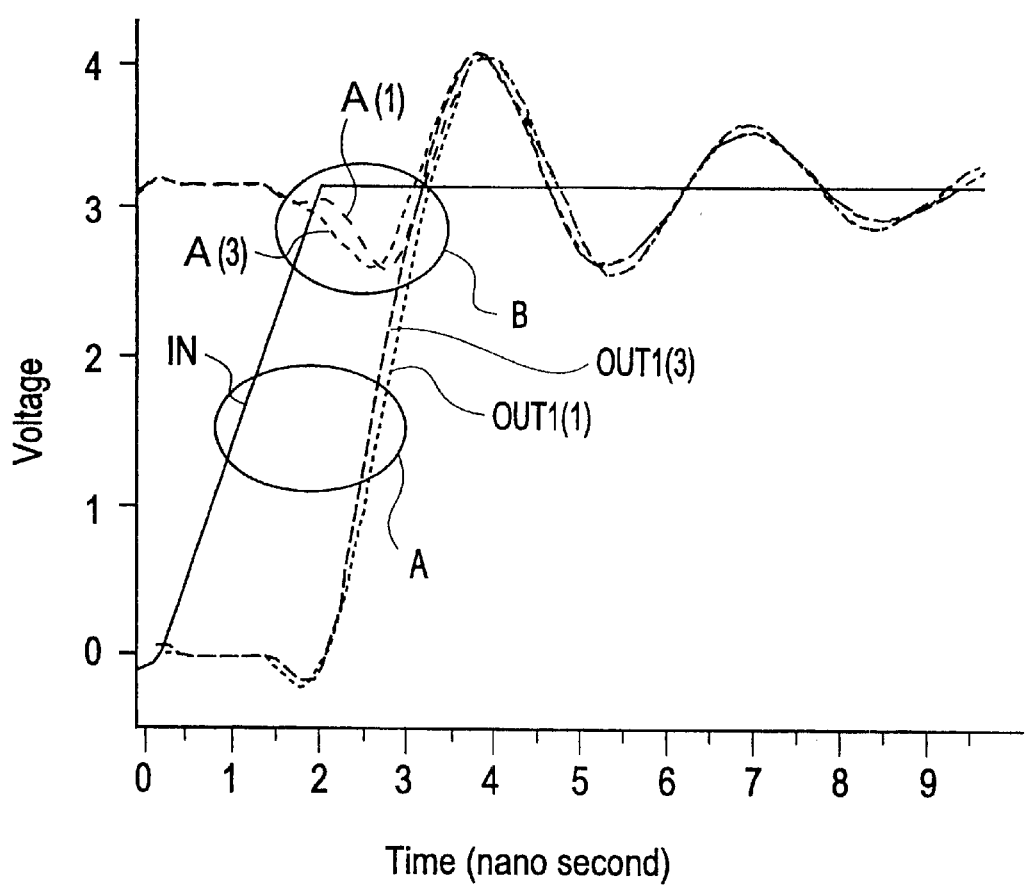
FIG. 13, FIG. 14 and FIG. 15 are graphs for comparing the operation of the output buffer circuits illustrated in FIG. 11 and FIG. 2.
Figure 14:
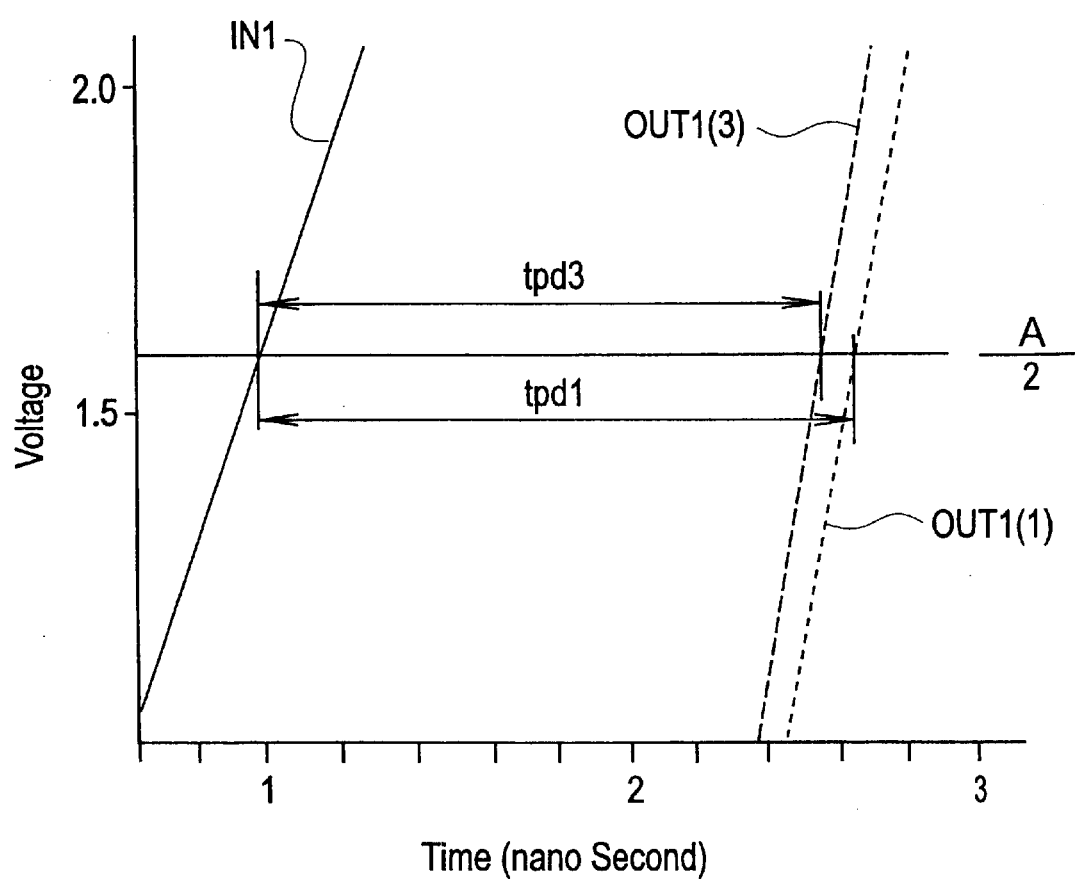
Figure 15:
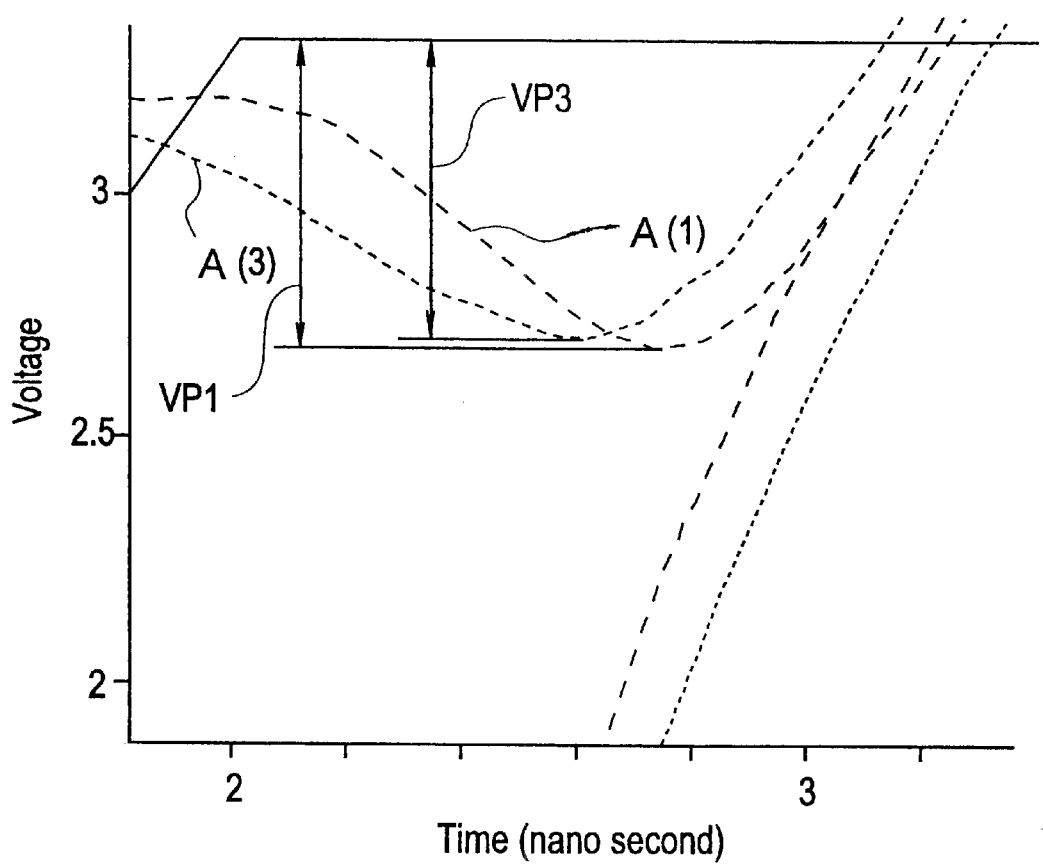

FIG. 13 is a diagram for comparing the operation of the output buffer circuit according to the third embodiment and the output buffer circuit according to the first embodiment. FIG. 14 is an enlarged view of area A of FIG. 13, and FIG. 15 is an enlarged view of area B of FIG. 13. In FIG. 13 to FIG. 15, OUT1(1) and A(1) represent the changes of the output voltage OUT1 and the potential of the node A of the output buffer circuit according to the first embodiment, and OUT1(3) and A(3) represent the output voltage OUT1 and the potential of the node A of the output buffer circuit according to the third embodiment.

In FIG. 13 and FIG. 14, tpd1 is the operational delay time of the output buffer circuit according to the first embodiment and tpd3 is the operational delay time of the output buffer circuit according to the third embodiment. Here, the delay time is the time difference between the electrical change of the signal input terminal IN1 and the electrical change of the signal output terminal OUT1. As clear from FIG. 13 and FIG. 14, delay time tpd3 is smaller than delay time tpd1. Thus, the output buffer circuit according to the present embodiment has a faster operational speed than the output buffer circuit according to the first embodiment.

In addition, as clear from FIG. 13 and FIG. 15, the peak potential VP3 of the output buffer circuit according to the present embodiment is higher than the peak potential VP1 of the output buffer circuit according to the first embodiment. Thus, the output buffer circuit according to the present embodiment malfunctions less than the output buffer circuit according to the first embodiment.

Further, similar to the first embodiment, the output buffer circuit of the present embodiment has a fast operation speed and low power consumption, because the nMOS transistor 222 has a high turn-off speed.

Fourth Embodiment

The output buffer circuit according to the fourth embodiment is now explained with reference to FIG. 16 to FIG. 18.

The overall structure of the output unit according to the present invention is the same as the output unit of the first embodiment (c.f. FIG. 1).

Figure 16:
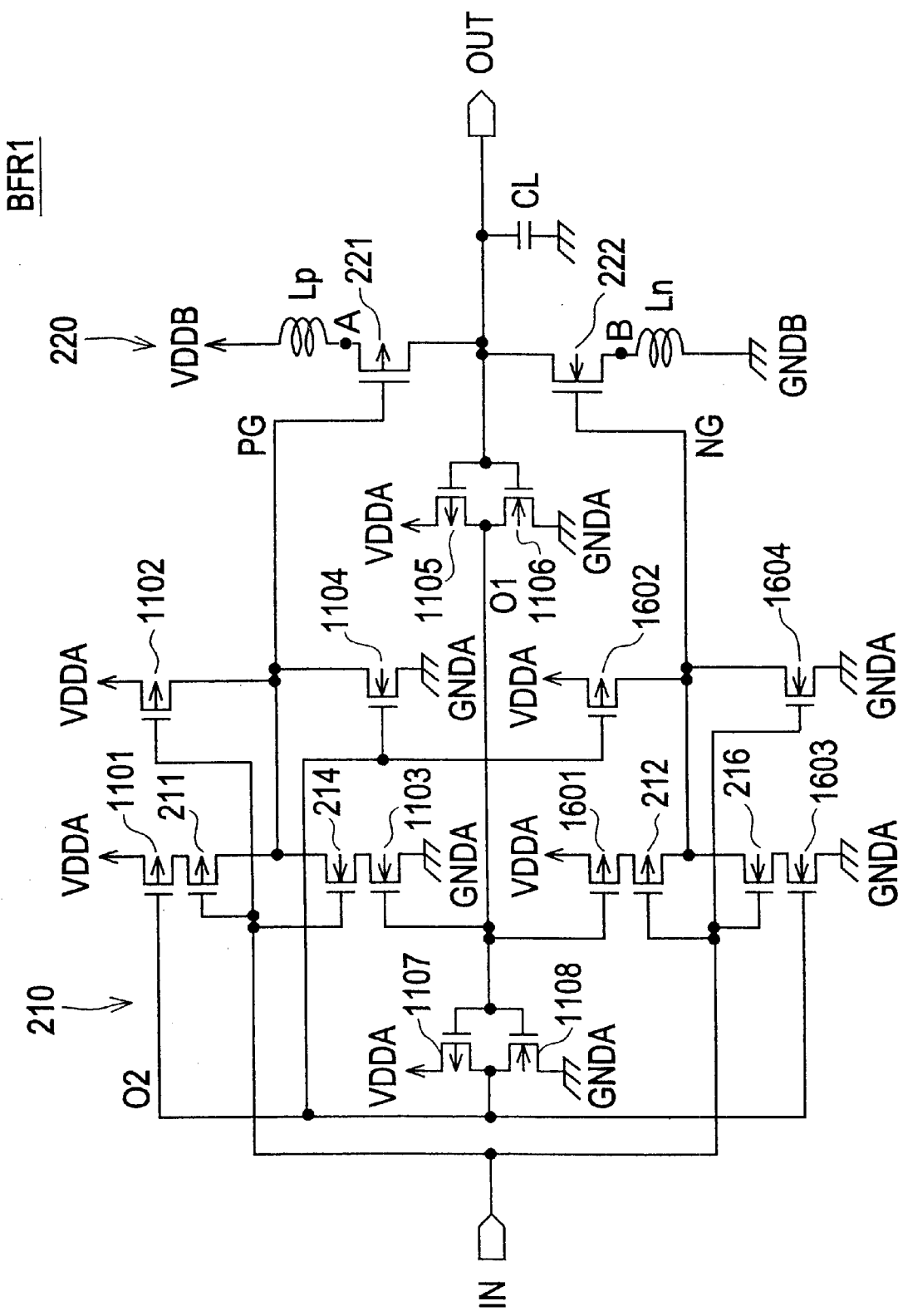
FIG. 16 is a circuit diagram showing the principle components of the output buffer circuit according to the fourth embodiment.

FIG. 16 is a circuit diagram showing the internal structure of the output buffer circuit BFR1. The internal structure of the other output buffer circuits BFR2 to BFRn, BFRm is also the same as FIG. 16. In FIG. 16, the structural components having the same reference numeral as FIG. 11 are the same as with FIG. 11, respectively.

As shown in FIG. 16, the predriver unit 210 of the present embodiment comprises pMOS transistors 1601, 1602 and nMOS transistors 1603, 1604.

The PMOS transistor 1601 is provided between the PMOS transistor 212 and the power supply line VDDA.

That is, in the pMOS transistor 1601, the source is connected to the power supply line VDDA and the drain is connected to the source of the pMOS transistor 212. The gate of the pMOS transistor 1601 is connected to the node O1.

In the pMOS transistor 1602, the source is connected to the power supply source VDDA, the drain is connected to the node NG, and the gate is connected to the node O2.

The nMOS transistor 1603 is provided between the nMOS transistor 216 and the power supply line VDDA. That is, in the nMOS transistor 1603, the source is connected to the power supply line GNDA and the drain is connected to the source of the nMOS transistor 211. The gate of the nMOS transistor 1603 is connected to the node O2.

In the nMOS transistor 1604, the source is connected to the power supply source GNDA, the drain is connected to the node NG, and the gate is connected to the signal input terminal IN1.

Figure 17:
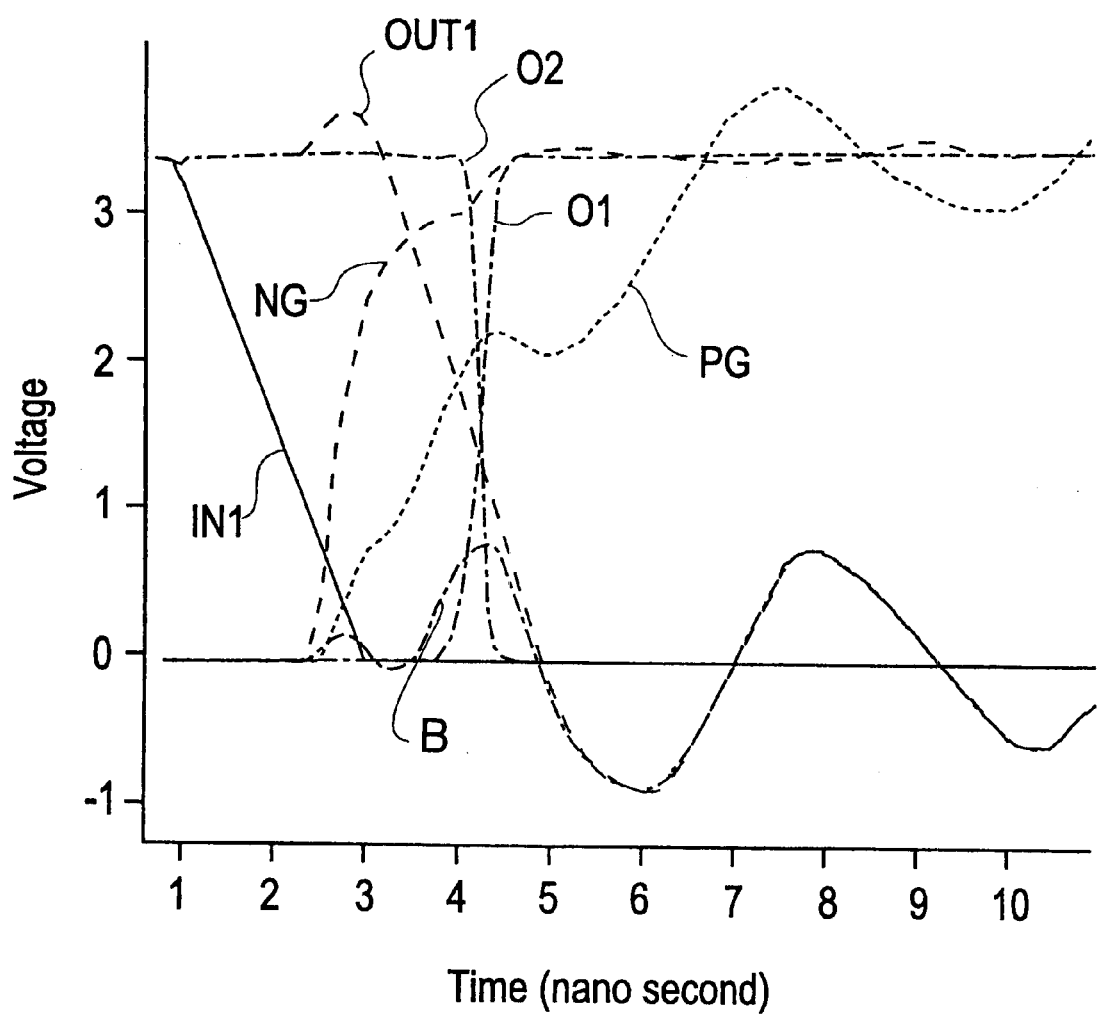
FIG. 17 is a graph showing the operation of the output buffer circuit illustrated in FIG. 16.

FIG. 17 is a diagram showing the electrical change of IN1, OUT1, B, PG, NG, O1 and O2 when the potential of the signal input terminal IN1 is changed from a high level to a low level.

As clear from FIG. 17, when the potential of the signal input terminal IN1 is of a high level, the signal output terminal OUT1 is of a high level, the node O1 is of a low level, and the node O2 is of a high level. Here, the nMOS transistors 216, 1603, 1604 and the PMOS transistor 1601 are turned on, and the pMOS transistors 212, 1602 are turned off. Thus, the node NG is of a low level and, therefore, the nMOS transistor 222 is turned off. Moreover, the nMOS transistors 214, 1104 are turned on, and the nMOS transistor 1103 and the pMOS transistors 211, 1101, 1102 are turned off. Thus, the node PG is of a low level and, therefore, the pMOS transistor 222 is turned on.

When the potential of the signal input terminal IN1 changes to a low level, the nMOS terminals 216, 1604 turns off, and the pMOS transistor 212 turns on. Since the pMOS transistor 1601 has already been turned on, the potential of the node NG rises. And, when the potential of the node NG reaches the threshold value of the nMOS transistor 222, the nMOS transistor 222 turns on. Meanwhile, when the potential of the signal input terminal IN1 changes to a low level, the pMOS transistor 1102 turns on and, therefore, the potential of the node PG rises. Thus, the current of the pMOS transistor 221 decreases. The potential of the signal output terminal OUT1 thereby falls.

When the potential of the signal output terminal OUT1 rises, the potential of the node O1 falls and, therefore, the potential of the node O2 rises. And, when the potential of the node O1 reaches the threshold value of the pMOS transistor 1601, this PMOS transistor 1601 turns off. Here, the potential of the node O2 has not yet reached the threshold value of the pMOS transistor 1602. Thus, this nMOS transistor 1602 turns off and, therefore, the node NG become in a floating state. Thereafter, when the potential of the node O2 reaches the threshold value of the pMOS transistor 1602, the pMOS transistor 1602 turns on. When the node NG reaches a complete high level, the nMOS transistor 222 turns on completely. Further, when the node O2 becomes a low level, the nMOS transistor 1104 turns off, and the pMOS transistor 1101 turns on. And, when the node PG reaches a complete high level, the pMOS transistor 221 turns off completely.

As described above, the output buffer circuit of the present embodiment liberalizes the on-operation of the nMOS transistor 222 by utilizing the delay of the turn-on of the inverters 1107, 1108.

Next, the operation of the output buffer circuit according to the present embodiment is compared with the operation of the output buffer circuit according to the second embodiment.

Figure 18:
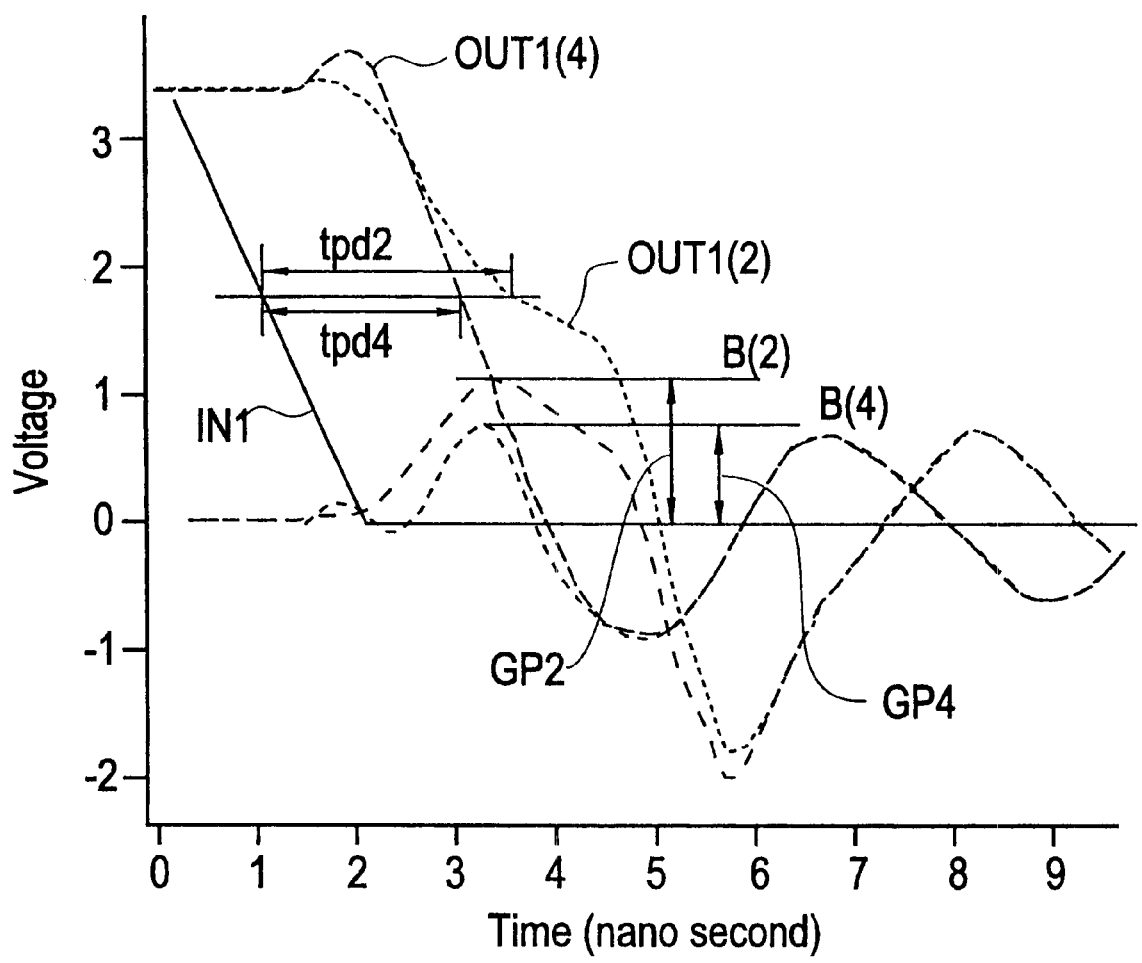
FIG. 18 is a graph for comparing the operation of the output buffer circuits illustrated in FIG. 16 and FIG. 7.

FIG. 18 is a diagram for comparing the operation of the output buffer circuit according to the fourth embodiment and the operation of the output buffer circuit according to the second embodiment. In FIG. 18, OUT1(2) and B(2) represent the changes of the output voltage OUT1 and the potential of the node B of the output buffer circuit according to the second embodiment, and OUT1 (4) and B(4) represent the output voltage OUT1 and the potential of the node B of the output buffer circuit according to the fourth embodiment.

In FIG. 18, tpd2 is the operational delay time of the output buffer circuit according to the second embodiment and tpd4 is the operational delay time of the output buffer circuit according to the fourth embodiment. As clear from FIG. 18, delay time tpd4 is smaller than delay time tpd2. Thus, the output buffer circuit according to the present embodiment has a faster operational speed than the output buffer circuit according to the second embodiment.

In addition, as clear from FIG. 18, the peak potential GP4 of the output buffer circuit according to the present embodiment is higher than the peak potential GP2 of the output buffer circuit according to the second embodiment. Thus, the output buffer circuit according to the present embodiment malfunctions less than the output buffer circuit according to the second embodiment.

Further, similar to the second embodiment, the output buffer circuit of the present embodiment has a fast operation speed and low power consumption, because the pMOS transistor 221 and nMOS transistor 222 has a high turn-off speed.

What is claimed is:

1. An output buffer circuit of a semiconductor integrated circuit comprising:

a main driver having a first transistor that increases and decreases current flowing between a signal output terminal and a first power supply line inversely depending on a first control potential, and a second transistor that increases and decreases current flowing between said signal output terminal and a second power supply line depending on a second control potential; and a predriver that generates said first control potential and said second control potential by employing an input logic signal, and that reduces a speed of increase of the current flowing through said first transistor or said second transistor by prolonging a fall time of said first control potential or a rise time of said second control potential, said predriver comprising a first inverter having
a first transistor of a first conductivity type having one end connected to a third power supply line, an other end connected to a first node, and a control terminal connected to said logic signal,
a second transistor of a second conductivity type having one end connected to a fourth power supply line, an other end connected to a second node, and a control terminal connected to said logic signal,
a third transistor of the second conductivity type having one end connected to said second node, an other end connected to said first node, and a control terminal connected to said logic signal, and
a fourth transistor of the second conductivity type having one end connected to said third power supply line, an other end connected to said second node, and a control terminal connected to said first node,
wherein said first node supplies said first control potential to said first transistor.

2. The output buffer circuit of a semiconductor integrated circuit according to claim 1, wherein said predriver further comprises a second inverter having:

a fifth transistor of the first conductivity type having one end connected to said third power supply line, an other end connected to a third node, and a control terminal connected to said logic signal; and a sixth transistor of the second conductivity type having one end connected to said fourth power supply line, an other end connected to said third node, and a control terminal connected to said logic signal, wherein said third node supplies said second control potential to said second transistor.

3. The output buffer circuit of a semiconductor integrated circuit according to claim 1, wherein said predriver further comprises a second inverter having:

a fifth transistor of the first conductivity type having one end connected to said third power supply line, an other end connected to a third node, and a control terminal connected to said logic signal;

a sixth transistor of the first conductivity type having one end connected to said third node, an other end connected to a fourth node, and a control terminal connected to said logic signal;

a seventh transistor of the first conductivity type having one end connected to said fourth power supply line, an other end connected to said third node, and a control terminal connected to said fourth node; and an eighth transistor of the second conductivity type having one end connected to said fourth power supply line, an other end connected to said fourth node, and a control terminal connected to said logic signal, wherein said fourth node supplies said second control potential to said second transistor.

4. The output buffer circuit of a semiconductor integrated circuit according to claim 1, comprising a plurality of said main drivers and a plurality of said predrivers corresponding respectively to the plurality of said main drivers, wherein said first power supply line and said second power supply line are commonly connected to all of the plurality of said main drivers.

5. The output buffer circuit of a semiconductor integrated circuit according to claim 4, wherein said logic signal input to one of the plurality of said predrivers is fixed to a high level.

6. The output buffer circuit of a semiconductor integrated circuit according to claim 4, wherein said logic signal input to one of the plurality of said predrivers is fixed to a low level.

7. The output buffer circuit of a semiconductor integrated circuit according to claim 1, wherein said first power supply line and second power supply line are connected to an external power source via a lead wire.

8. An output buffer circuit of a semiconductor integrated circuit comprising:

a main driver having a first transistor that increases and decreases current flowing between a signal output terminal and a first power supply line inversely depending on a first control potential, and a second transistor that increases and decreases current flowing between said signal output terminal and a second power supply line depending on a second control potential; and a predriver that generates said first control potential and said second control potential by employing an input logic signal, and that reduces a speed of increase of the current flowing through said first transistor or said second transistor by prolonging a fall time of said first control potential or a rise time of said second control potential, said predriver comprising a first inverter having an input terminal connected to said signal output terminal and an output terminal connected to a first node, a second inverter having an input terminal connected to said first node and an output terminal connected to a second node, a third transistor of the first conductivity type having one end connected to a third power supply line and a control terminal connected to said second node, a fourth transistor of the first conductivity type having one end connected to an other end of said third transistor, an other end connected to a third node, and a control terminal connected to said logic signal, a fifth transistor of the first conductivity type having one end connected to said third power supply line, an other end connected to said third node, and a control terminal connected to said logic signal, a sixth transistor of the second conductivity type having one end connected to a fourth power supply line and a control terminal connected to said first node, a seventh transistor of the second conductivity type having one end connected to an other end of said sixth transistor, an other end connected to said third node, and a control terminal connected to said logic signal, and an eighth transistor of the second conductivity type having one end connected to said fourth power supply line, an other end connected to said third node, and a control terminal connected to said second node, wherein said third node supplies said first control potential to said first transistor.

9. The output buffer circuit of a semiconductor integrated circuit according to claim 8, wherein said predriver further comprises:

a ninth transistor of the first conductivity type having one end connected to said third power supply line, an other end connected to a fourth node, and a control terminal connected to said logic signal;

a tenth transistor of the first conductivity type having one end connected to said fourth node, an other end connected to a fifth node, and a control terminal connected to said logic signal;

an eleventh transistor of the first conductivity type having one end connected to said fourth power supply line, an other end connected to said fourth node, and a control terminal connected to said fifth node; and a twelfth transistor of the second conductivity type having one end connected to said fourth power supply line, an other end connected to said fifth node, and a control terminal connected to said logic signal, wherein said fifth node supplies said second control potential to said second transistor.

10. The output buffer circuit of a semiconductor integrated circuit according to claim 8, wherein said predriver further comprises:

a ninth transistor of the first conductivity type having one end connected to said third power supply line, an other end connected to a fourth node, and a control terminal connected to said logic signal; and a tenth transistor of the second conductivity type having one end connected to said fourth power supply line, an other end connected to said fourth node, and a control terminal connected to said logic signal, wherein said fourth node supplies said second control potential to said second transistor.

11. The output buffer circuit of a semiconductor integrated circuit according to claim 8, wherein said predriver further comprises:
- a ninth transistor of the first conductivity type having one end connected to said third power supply line and a control terminal connected to said first node;
- a tenth transistor of the first conductivity type having one end connected to an other end of said ninth transistor, an other end connected to a fourth node, and a control terminal connected to said logic signal;
- an eleventh transistor of the first conductivity type having one end connected to said third power supply line, an other end connected to said fourth node, and a control terminal connected to said second node;
- a twelfth transistor of the second conductivity type having one end connected to a fourth power supply line and a control terminal connected to said second node;
- a thirteenth transistor of the second conductivity type having one end connected to an other end of said twelfth transistor, an other end connected to said fourth node, and a control terminal connected to said logic signal; and
- a fourteenth transistor of the second conductivity type having one end connected to said fourth power supply line, an other end connected to said fourth node, and a control terminal connected to said logic signal,
- wherein said fourth node supplies said second control potential to said second transistor.

12. An output buffer circuit of a semiconductor integrated circuit, comprising:
- a first CMOS inverter having a first pMOS transistor and a first nMOS transistor provided in series between a first power supply line and a first ground line, wherein a connecting point between said first pMOS transistor and said first nMOS transistor is an output of said first CMOS inverter;
- a second CMOS inverter having a second pMOS transistor and a second nMOS transistor provided in series between said first power supply line and said first ground line, wherein a connecting point between said second pMOS transistor and said second nMOS transistor is an output of said second CMOS inverter;
- a main driver having a third pMOS transistor and a third nMOS transistor provided in series between a second power supply line and a second ground line, wherein a gate terminal of said third pMOS transistor is coupled to the output of said first CMOS inverter and wherein a gate terminal of said third nMOS transistor is coupled to the output of said second CMOS inverter;
- a fourth nMOS transistor provided between said first nMOS transistor and said first ground line, a gate terminal of said fourth nMOS transistor is coupled to a gate terminal of said first nMOS transistor; and
- a fifth nMOS transistor having a drain connected to said first power supply line, a source connected to a connecting point between said first and fourth nMOS transistors, and a gate terminal connected to the output of said first CMOS inverter.

13. An output buffer circuit of a semiconductor integrated circuit, comprising:
- a first CMOS inverter having a first pMOS transistor and a first nMOS transistor provided in series between a first power supply line and a first ground line, wherein a connecting point between said first pMOS transistor and said first nMOS transistor is an output of said first CMOS inverter;
- a second CMOS inverter having a second pMOS transistor and a second nMOS transistor provided in series between said first power supply line and said first ground line, wherein a connecting point between said second pMOS transistor and said second nMOS transistor is an output of said second CMOS inverter;
- a main driver having a third pMOS transistor and a third nMOS transistor provided in series between a second power supply line and a second ground line, wherein a gate terminal of said third pMOS transistor is coupled to the output of said first CMOS inverter and wherein a gate terminal of said third nMOS transistor is coupled to the output of said second CMOS inverter;
- a fourth pMOS transistor provided between said second pMOS transistor and said first power supply line, a gate terminal of said fourth pMOS transistor is coupled to a gate terminal of said second pMOS transistor; and
- a fifth pMOS transistor having a source connected to said first ground line, a drain connected to a connecting point between said second and fourth pMOS transistors, and a gate connected to the output of said second CMOS inverter.

* * * * *